United States Patent

Go et al.

[11] Patent Number: 5,144,531
[45] Date of Patent: Sep. 1, 1992

[54] ELECTRONIC APPARATUS COOLING SYSTEM

[75] Inventors: Hiroshi Go, Zama; Shizuo Zushi; Mitsuo Miyamoto, both of Hadano, all of Japan

[73] Assignee: Hitachi, Ltd., Tokyo, Japan

[21] Appl. No.: 637,690

[22] Filed: Jan. 7, 1991

[30] Foreign Application Priority Data

Jan. 10, 1990 [JP]  Japan .................................. 2-1540

[51] Int. Cl.$^5$ ............................................. H05K 7/20
[52] U.S. Cl. ................................ 361/382; 165/80.4; 361/385
[58] Field of Search ............... 361/381, 382, 385, 386; 165/80.4, 80.5; 137/614.01, 614.02, 614.03, 614.04, 614.05; 357/82

[56] References Cited

U.S. PATENT DOCUMENTS

3,481,393  12/1969  Chu .
4,791,983  12/1988  Nicol et al. ..................... 165/80.4

OTHER PUBLICATIONS

"Liquid Cooling Multichip Packages", Nikkei Electronics, 1985, Murano et al., pp. 243-266.

Primary Examiner—Gerald P. Tolin
Attorney, Agent, or Firm—Fay, Sharpe, Beall, Fagan, Minnich & McKee

[57] ABSTRACT

In a liquid cooling system comprising cold plates attached to their respective circuit modules, quick couplers are provided for connecting flexible hoses to these cold plates, a supply duct and a return duct to form strings of cold plates connected between the supply duct and the return duct. Valved quick couplers are used for the connection to the supply duct and the return duct, and valveless quick couplers are used for the connection to the cold plates. When a circuit module is to be serviced, a desired string of cold plates is disconnected from the supply duct and the return duct by disjoining the valved quick couplers for the connection thereto. The disconnected string of cold plates is drained of the coolant, and then the cold plate attached to the desired circuit module is disconnected from the hoses. Subsequently the desired circuit module and the cold plate attached thereto can be detached as one body from an associated connector.

8 Claims, 3 Drawing Sheets

ELECTRONIC APPARATUS COOLING SYSTEM

BACKGROUND OF THE INVENTION

This invention relates to a cooling system for an electronic apparatus, and more particularly to a liquid cooling system wherein each circuit module is cooled with a liquid via a cold plate or cooling chamber, and a handling method thereof.

A multichip module comprising a number of high density LSIs mounted on a relatively small circuit board generates a large amount of heat per unit area. Accordingly, a liquid cooling system is often employed wherein each module is cooled with a liquid via a cold plate or cooling chamber. Examples of this type of cooling system are disclosed in U.S. Pat. No. 3,481,393 of Richard C. Chu, issued on Dec. 2, 1969, and in "Liquid-cooling Multichip Packages" by Murano et al., NIKKEI ELECTRONICS, 1985.6.17, pp.243-266.

In such a liquid cooling system a cold plate or cooling chamber is attached to each multichip module such that one side of the cold plate is in tight contact with the multichip module to obtain high heat conductivity. The cold plate has a coolant path provided therein, and a plurality of cold plates are connected in series by flexible hoses or conduits to form a string of cold plates. A plurality of such strings are connected in parallel between the supply duct and the return duct of a coolant circulating system.

As explained in the above-mentioned U.S. patent, the prior art liquid cooling systems attach importance to ease with which any cold plate or cooling chamber can be detached from its associated multichip module with hoses being kept connected thereto. This feature is advantageous in that any module can be serviced or replaced without stopping the coolant circulation, that is, without affecting the cooling of other modules.

As the amount of heat generated by each multichip module increases, improvement in cooling efficiency is required. Thus it is desired to reduce the heat resistance between the multichip module and the cold plate or cooling chamber as much as possible. In order to achieve this, the contact condition of the cold plate to the multichip module must be carefully adjusted so that the best condition may be realized. It is usual to apply a heat conductive grease or compound onto both of the facing contacting surfaces in order to decrease the heat resistance.

Under those circumstances the detaching of the cold plate from the multichip module for maintenance or service produces problems. When a cold plate, once detached from a multichip module, is to be attached again to the same or a new multichip module, the above-described careful adjustment of the contact condition or the wiping off and reapplication of the grease is necessary. Unfortunately, it is difficult at the spot where the machine is in use to achieve the delicate adjustment of the contact condition owing to poor facilities. Also, the removal and reapplication of the grease take a considerable length of time, during which the system is left unavailable, and the use of the grease must be given up if the circumstances are unfavorable.

SUMMARY OF THE INVENTION

An object of this invention is to provide a cooling system wherein hoses or conduits can be disconnected from and reconnected to cold plates or cooling chambers with ease, thereby allowing the cold plate and the circuit module to be handled as one body.

Another object of this invention is to prevent the coolant from flowing away while the hose is left disconnected from the cold plate.

Another object of this invention is to limit the area that should be drained of the coolant before the hose is disconnected from the cold plate.

Still another object of this invention is to prevent the discharged coolant from being lost.

A further object of this invention is to achieve the above objects with a minimal number of valves, thereby holding down the increase of the load on the coolant circulating system.

In accordance with the present invention, a plurality of quick couplers or one-touch couplers are provided for connecting flexible hoses to a supply duct, a return duct and cooling plates, respectively, thereby forming a string of cooling plates connected between the supply duct and the return duct. A plurality of such strings may be provided. Valved quick couplers are used at least for the connection to the supply duct and the return duct. Valveless quick couplers may preferably be used for the connection to the cooling plates. Under certain circumstances, the return duct may be provided with a watch window through which the coolant is visible.

When service to a circuit module is required, two valved quick couplers between which a channel including a desired cooling plate extends are each disjoined. Then a coupler piece (a plug or a socket) provided at one end of this channel is joined with a mated coupler piece (a socket or a plug) which is connected to a discharge pressure device, while a coupler piece at the other end is joined with a mated coupler piece which is connected to a drain hose. Subsequently, the discharge pressure device is activated to expel the coolant out of the hoses and cooling plates lying between these two valved quick couplers. After discharging the coolant, a desired cooling plate is disconnected from its associated hoses, and then this disconnected cooling plate and the circuit module attached thereto are detached as one body from the apparatus.

Where one of these two valved quick couplers is the one connecting the return duct to a hose, this valved quick coupler may be kept intact while all other strings of cooling plates are disconnected from the return duct, and a discharge pressure device may be connected to the coupler piece of the other valved quick coupler. In this configuration, the return duct may be disconnected from the hose, and reconnected to it with an additional hose having a watch window.

With the cooling system of this invention, the hose and the cooling plate can be promptly disconnected and reconnected by the simple handling of the quick coupler. Therefore, the cooling plate and the circuit module can be handled as one body during maintenance or service. As a result, it becomes unnecessary to carry out the adjustment of the contact condition between the cooling plate and the circuit module at the spot where the machine is installed and in use, whereby the maintenance and service can be performed easily and quickly. In addition, it becomes practical to rigidly fix the cooling plate and the circuit module by gluing or soldering, or rather to construct them in a monoblock structure, so as to attain more efficient heat conduction.

The adoption of the valved quick coupler not only prevents the coolant from flowing away while the coupler is left disjoined, but also makes it possible to confine the area requiring to be drained of the coolant to a portion lying between two valved quick couplers or a portion lying between a valved quick coupler and the return duct. On the other hand, the valved quick coupler inherently causes a large pressure loss. The total pressure loss can be held down to a minimal value by using valveless quick couplers for connecting hoses to cooling plates that are provided in great numbers.

The watch window is also helpful to limiting the area to be drained of the coolant. When the coolant is found to have receded as far as the position of the watch window, it is evident that the hoses and cooling plates above there have been drained. Then the discharging process may be terminated.

When the coolant is to be discharged out of the circulating system, it is sufficient to discharge the coolant contained within a single string of hoses and cooling plates. When the method of discharging into the return duct is adopted, the discharged coolant flows into the storage tank, thereby being saved from being lost.

The foregoing and other objects, features and advantages of this invention will be apparent from the following description.

DESCRIPTION OF THE PREFERRED EMBODIMENT

Figure 1:
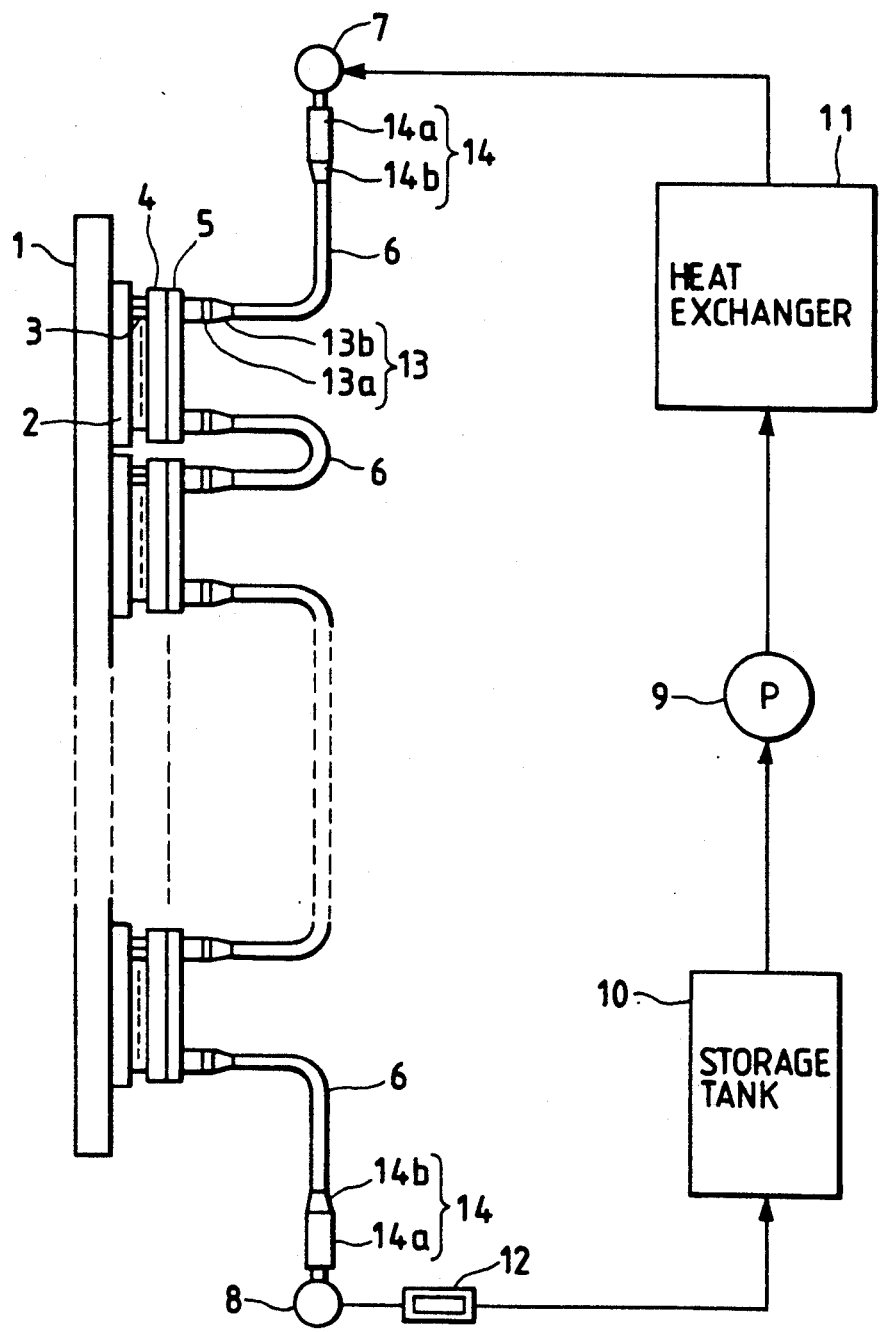
FIG. 1 shows an embodiment of the cooling system of the present invention.

Referring to FIG. 1, there is schematically shown a cooling system as an embodiment of the present invention. A mother board 1 has a plurality of connectors 2. A multichip module 4 having a number of connector pins 3 is attached to each of the connectors 2. Each multichip module 4 is tightly contacted with a cold plate 5 such that good heat conductivity is obtained between them. Flexible hoses 6 connect a group of the cold plates 5 in series between a supply manifold 7 and a return manifold 8. Although not shown in the figure, a number of similar strings of cold plates connected in series by hoses may be connected in parallel between these manifolds 7 and 8. A coolant, such as water, antifreezing solution or the like, is circulated by a pump 9 from a storage tank 10 through a heat exchanger 11, the supply manifold 7, the strings of the hoses 6 and the cold plates 5, and the return manifold 8, then back to the storage tank 10. A transparent watch window 12 is provided on a return duct as near the return manifold 8 as possible. The cold plate 5 and the hose 6 are connected by a valveless quick coupler 13 consisting of a socket 13a and a plug 13b, while the first hose and the last hose of the string of series-connected cold plates and hoses are connected to the supply manifold 7 and the return manifold 8, respectively, by valved quick couplers 14 each consisting of a socket 14a and a plug 14b.

The quick coupler (or one-touch coupler) is a coupler or joint which can be promptly joined and disjoined by a simple manual action such as merely sliding a ring or moving a lever, necessitating no labor such as turning a nut many times. Also, the valved quick coupler means a quick coupler having valves in the socket and the plug, respectively, these valves being automatically opened upon joining and closed upon disjoining. Various quick couplers are commercially available. If there is no valve, the coolant will flow out unlimitedly while the quick coupler is left disjoined, and the apparatus will eventually be damaged. Valved quick couplers may also be used for connecting the hose to the cooling plate. On the other hand, the valved quick coupler is disadvantageous in that it not only is expensive but it also causes a large pressure loss. Therefore, if the valved quick coupler is used for connecting every cold plate 5 to the hose 6, the total pressure loss will be very large since there are a very large number of cold plates. As a result, a pump 9 of a much larger capacity will be necessitated, resulting in a further increase in cost. For this reason, it is advisable to use the valveless quick coupler for connecting the hose to the cold plate.

Figure 2:
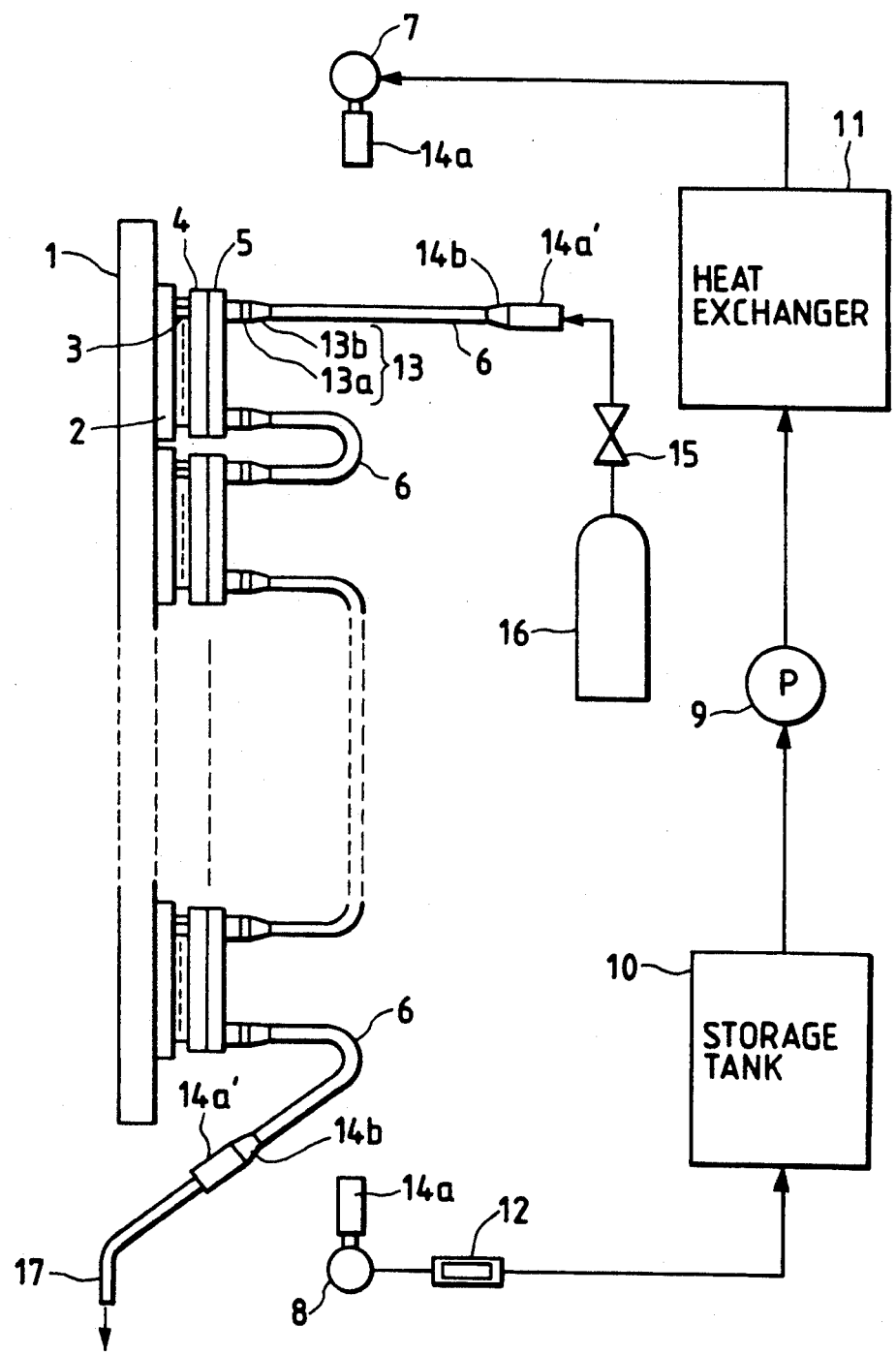
FIG. 2 shows an alteration of the interconnection of FIG. 1 for discharging the coolant; and, FIG. 3 shows another alteration of the interconnection of FIG. 1 for discharging the coolant in a different manner.

FIG. 2 shows an alteration of the interconnection of FIG. 1 for discharging the coolant in order to access one of the multichip modules 4 for maintenance or service. The process for obtaining the interconnection of FIG. 2 starting from that of FIG. 1 is as follows:

(1) Disjoin the socket 14a and the plug 14b of each of the valved quick couplers connecting the end hoses of a desired string of cold plates to the supply manifold 7 and the return manifold 8, respectively. Upon disjoining, valves within the socket 14a and the plug 14b close, thereby preventing the coolant from flowing out.

(2) Join the plug 14b of the hose disconnected from the supply manifold 7 with a mated socket 14a' which is connected via a valve 15 to a discharge pressure device 16. The socket 14a' is identical to the socket 14a. The discharge pressure device 16 may be a compressor or a compressed gas cylinder.

(3) Join the plug 14b of the hose disconnected from the return manifold 8 with a mated socket, 14a', which is connected to a drain hose 17.

Thus the interconnection shown in FIG. 2 is obtained. Then the valve 15 is opened, and the coolant in the hoses 6 and the cold plates 5 of the desired string is discharged out through the drain hose 17. Thereafter, the cold plate 5 attached to a desired multichip module can be readily disconnected from the hose 6 by disjoining the socket 13a and the plug 13b of the quick coupler connecting them. Although this quick coupler has no valve, the coolant does not happen to flow out during this disconnection, since the coolant has already been discharged. Then, a serviceman is able to extract the desired multichip module 4 together with the associated cold plate 5 as one body from the connector 2.

Figure 3:
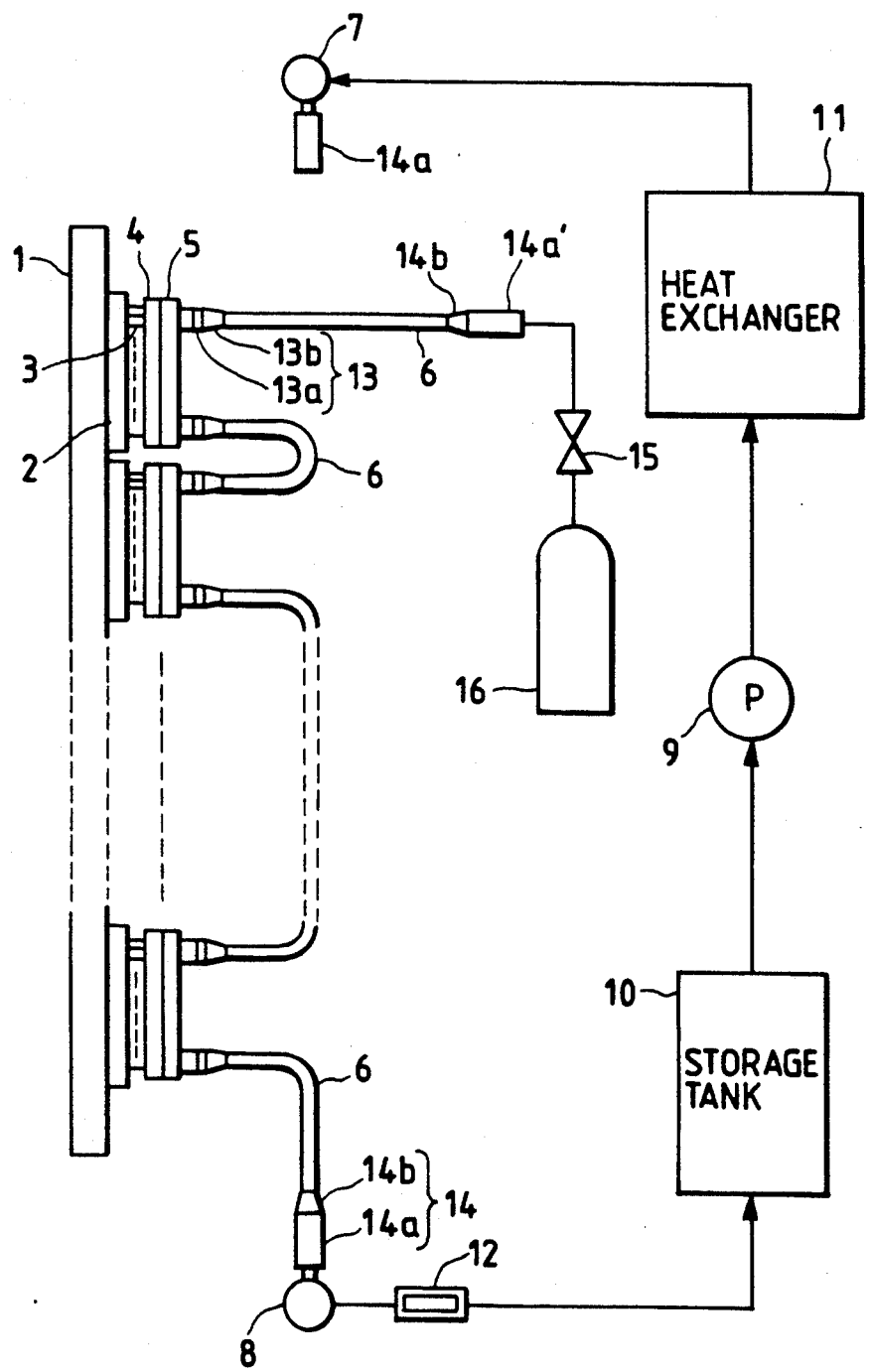

FIG. 3 shows another interconnection for coolant discharge. This interconnection is reached from that of FIG. 1 through the aforementioned steps (1) to (3), excluding the disconnection from the return manifold 8 in step (1), and step (3) in its entirety. All other strings of cold plates are disconnected from the return manifold 8.

In this interconnection, the valve 15 is opened. Then the coolant in the desired series of hoses and cold plates is discharged towards the storage tank 10. Meanwhile, a serviceman may observe the coolant in the duct through the watch window 12, and terminate the discharging process by closing the valve 15 when the discharge has progressed to the position of the watch window 12. The duct portion extending from the return manifold 8 to the storage tank 10 is considerably long. Accordingly, if all the coolant in this portion is to be discharged into the storage tank 10, a long period of time and the supply of a large amount of compressed gas will be required, and moreover, a considerably larger storage tank 10 must be provided. The watch window 12 is helpful for avoiding such extravagance.

The interconnection shown in FIG. 3 may be modified such that the socket 14a and the plug 14b of the valved quick coupler connecting the return manifold 8 to the hose are also disjoined, and an auxiliary hose with a watch window having a mated plug at one end and a mated socket at the other end is connected between the disjoined socket and plug.

If the capacity of the pump 9 is ample, some or all of the cold plates 5 may be connected to respective hoses 6 by means of valved quick couplers.

What is claimed is:

1. In an electronic apparatus cooling system comprising a plurality of circuit modules mounted on an electronic apparatus, a plurality of cooling plates each having a coolant path and being coupled heat conductively with a different one of said circuit modules, a supply duct, a return duct, a plurality of flexible hoses for connecting said coolant paths of the cooling plates in series between said supply duct and said return duct, and a circulating system for circulating a coolant through said supply duct, said series-connected coolant paths and hoses and said return duct, the improvement comprising a plurality of quick couplers for connecting said hoses to said supply duct, said return duct and said coolant paths, respectively; wherein at least the quick couplers for connecting the hoses to said supply duct and said return duct, respectively, are valved quick couplers.

2. The improvement as claimed in claim 1, wherein the quick couplers for connecting said hoses to said coolant paths are valveless quick couplers.

3. The improvement as claimed in claim 1, further comprising a watch window which is provided on said return duct and through which the coolant in said return duct is visible.

4. The improvement as claimed in claim 1, wherein all said quick couplers are valved quick couplers.

5. A method for handling an electronic apparatus cooling system comprising a plurality of circuit modules mounted on an electronic apparatus, a plurality of cooling plates each having a coolant path and being coupled heat conductively with a different one of said circuit modules, a supply duct, a return duct, a plurality of flexible hoses for connecting said coolant paths of the cooling plates in series between said supply duct and said return duct, a circulating system for circulating a coolant through said supply duct, said series-connected coolant paths and hoses and said return duct, and a plurality of quick couplers connecting said hoses to said supply duct, said return duct and said coolant paths, respectively, at least the quick couplers connecting the hoses to said supply duct and said return duct, respectively, being valved quick couplers, said method comprising the steps of:

disjoining a first one and a second one of said valved quick couplers between which a channel including a desired cooling plate extends;
joining a coupler piece of said first valved quick coupler with a mated coupler piece which is connected to a discharge pressure device and joining a coupler piece of said second valved quick coupler with a mated coupler piece which is connected to a drain hose such that the channel including said desired cooling plate is connected between said discharge pressure device and said drain hose;
discharging by means of said discharge pressure device the coolant out of the coolant paths and the hoses lying between said first and second valved quick couplers;
disjoining the quick couplers connecting the coolant path of said desired cooling plate to the hoses; and
detaching said desired cooling plate and the circuit module coupled therewith as one body from said electronic apparatus.

6. A method for handling an electronic apparatus cooling system comprising a plurality of circuit modules mounted on an electronic apparatus, a plurality of cooling plates each having a coolant path and being coupled heat conductively with a different one of said circuit modules, a supply duct, a return duct, a plurality of flexible hoses for connecting said coolant paths of the cooling plates in series between said supply duct and said return duct so as to form a plurality of cooling plate strings therebetween, a circulating system for circulating a coolant through said supply duct, said series-connected coolants paths and hoses and said return duct, and a plurality of quick couplers connecting said hoses to said supply duct, said return duct and said coolant paths, respectively, at least the quick couplers connecting the hoses to said supply duct and said return duct, respectively, being valved quick couplers, said method comprising the steps of:

disjoining a first valved quick coupler, which is arranged to couple said supply duct to a coolant path of a first cooling plate;
joining a coupler piece of said first valved quick coupler with a mated coupler piece which is connected to a discharge pressure device;
disconnecting strings of cooling plates, other than the string including the first cooling plate, from the return duct;
discharging by means of said discharge pressure device the coolant out of the coolant paths and the hoses connected between said first valved quick coupler and said return duct;
disjoining the quick couplers connecting the coolant path of the first cooling plate to the hoses; and
detaching said first cooling plate and the circuit module coupled therewith as one body from said electronic apparatus.

7. A method for handling an electronic apparatus cooling system as claimed in claim 6, further comprising the steps of disjoining a second valved quick coupler which couples the string of cooling plates including the first cooling plate to said return duct, and connecting a hose with a watch window having method coupler pieces at its respective ends between the coupler pieces of said disjoined second valved quick coupler.

8. A method for handling an electronic apparatus cooling system as claimed in claim 6, further comprising the step of inserting a watch window into the cooling system so that the discharge process may be monitored via the watch window.

* * * * *